United States Patent
Fuchs et al.

(10) Patent No.: US 6,823,206 B2
(45) Date of Patent: Nov. 23, 2004

(54) LOCAL COIL FOR MAGNETIC RESONANCE APPLICATIONS

(75) Inventors: Friedrich Fuchs, Roettenbach (DE); Rainer Kuth, Herzogenaurach (DE)

(73) Assignee: Siemens Aktiengesellschaft, Münich (DE)

(*) Notice: Subject to any disclaimer, the term of this patent is extended or adjusted under 35 U.S.C. 154(b) by 0 days.

(21) Appl. No.: 10/733,912

(22) Filed: Dec. 11, 2003

(65) Prior Publication Data

US 2004/0169514 A1 Sep. 2, 2004

(30) Foreign Application Priority Data

Dec. 11, 2002 (DE) ......................................... 102 57 909

(51) Int. Cl.[7] .................................................. A61B 5/05
(52) U.S. Cl. ..................................... 600/423; 324/318
(58) Field of Search ................................. 600/423, 422, 600/415, 410; 324/318, 322, 307, 309, 300

(56) References Cited

U.S. PATENT DOCUMENTS 5,170,789 A * 12/1992 Narayan et al. ............ 600/423
5,550,471 A    8/1996 Feld
6,263,229 B1 *  7/2001 Atalar et al. ............... 600/423
6,549,800 B1 *  4/2003 Atalar et al. ............... 600/423
6,675,033 B1 *  1/2004 Lardo et al. ............... 600/410

FOREIGN PATENT DOCUMENTS

WO    WO 93/05706    4/1993
WO    WO 01/09632    2/2001

* cited by examiner

*Primary Examiner*—Louis Arana
(74) *Attorney, Agent, or Firm*—Schiff Hardin LLP

(57) ABSTRACT

A local coil for magnetic resonance applications has an annular base body in which a reception antenna is embedded to receive a magnetic resonance signal. The base body is fashioned with inherent stability, such that it assumes an inherent form when not subjected to deformation forces. It is dimensioned such that it substantially assumes its inherent form given arrangement in a palate and/or in a nasal cavity of a person. Furthermore, it is flexibly fashioned, such that is can be inserted via a nostril of a person into the nasal cavity and removed again from it.

9 Claims, 1 Drawing Sheet

LOCAL COIL FOR MAGNETIC RESONANCE APPLICATIONS

BACKGROUND OF THE INVENTION

1. Field of the Invention

The present invention concerns a local coil for magnetic resonance applications, with an annular carrier or base body in which a reception antenna is embedded to receive a magnetic resonance signal.

2. Description of the Prior Art

Local coils of the above type are generally known. They are used in order to achieve a better magnetic resonance exposure from specific regions of an examination subject (normally a person) than is possible with a whole-body coil. Thus, for example, head, arm, leg and other local coils are known.

In the case of diseases of human tissue in the region of the base of the skull, for example pituitary tumors or inflammatory diseases of the eye organs, today head coils are used as a rule for examination. The head coils serve, depending on the design, either only to receive the magnetic resonance signal or both to excite and to receive the magnetic resonance signal.

The head of the patient fills such a head coil well. This coil shape is therefore well suited for an overall image of the head. Also, with such a head coil a significantly better image of the head can be generated in comparison with a whole-body coil. When a detail exposure of the base of the skull is needed, however, in individual cases the signal quality is unsatisfactory, particularly with regard to the signal-to-noise ratio and the measurement time required for the acquisition of the magnetic resonance signals.

A local coil for magnetic resonance applications is known from PCT Application WO 01/09632 that has an annular base body in which a reception antenna is embedded to receive a magnetic resonance signal. In this local coil, the base body is fashioned with inherent stability, such that it assumes an inherent form when not subjected to deforming forces. However, it is dimensioned and flexibly fashioned such that it can be inserted via a body opening of a person into the corresponding body cavity of the person and removed again from it. Within the body cavity of the person, the base body thereby assumes its inherent form.

According to PCT Application WO 01/09632, as a rule the local coil is inserted via an operative incision into the person in the body cavity of the person, for example the patient's abdominal cavity. It is moved by means of a rigid guide rod connected to the base body, however, guiding and positioning of the base body by means of a catheter is also noted.

A local coil for magnetic resonance applications is known from PCT Application 93/05706 that has a base body in which a reception antenna is embedded to receive a magnetic resonance signal. The base body is dimensioned and flexibly fashioned such that it can be rectally inserted into the bowel of a person and removed again therefrom.

A local coil for magnetic resonance applications is known from German OS 43 37 908 in which a pre-intensifier is arranged separate from a base body of the local coil.

SUMMARY OF THE INVENTION

An object of the present invention is to provide an improved local coil, with which diagnostic imaging of higher quality is possible in the region of the base of the skull.

The object is achieved in accordance with the invention by an MR local coil having a base with inherent stability, such that a state with no deforming forces acting thereon assumes an inherent form, with the base body being dimensioned such that it substantially assumes its inherent form given arrangement in the palate and/or in the nasal cavity of a person, and the base body is flexible, such that it can be inserted via a nostril into the nasal cavity and removed again from it.

The base body preferably is connected with an elastic supplementary body. The stability of the local coil can thereby be increased.

In the simplest embodiment, the supplementary body is simply provided and cannot be changed. Preferably, however, it has a connection with which it can be filled (inflated) with a gaseous or liquid medium. The local coil then can be placed more precisely at the base of the skull.

When the supplementary body is arranged on one side adjacent to the base body, the location of the local coil can be defined even more precisely.

When a pre-intensifier is arranged following (in the signal propagation direction) to the reception antenna, the signal-to-noise ratio can be improved even further.

The pre-intensifier alternatively can be integrated into the base body or be connected with the base body via a cable. When, in the latter case, the cable exhibits a length between 8 and 20 cm, the pre-intensifier can be arranged outside of the human body while the base body is inside the body, namely in the region of the palate or the nasal cavity.

DESCRIPTION OF THE PREFERRED EMBODIMENTS

Figure 1:
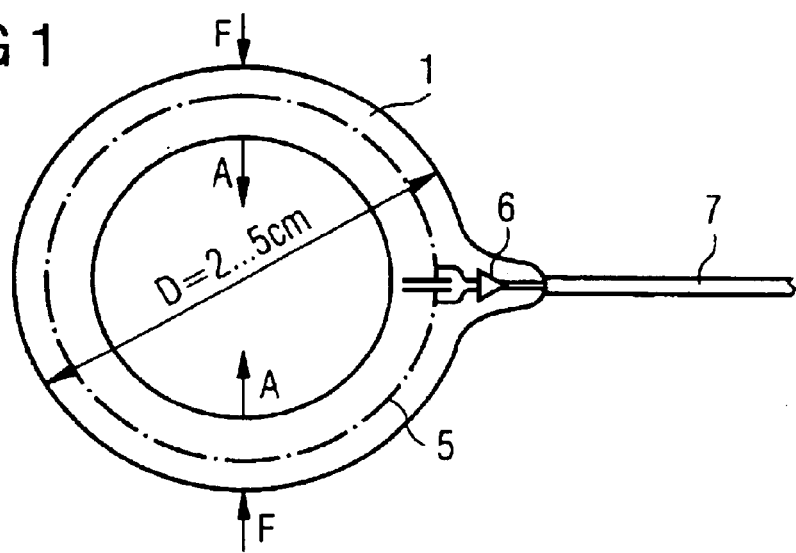
FIG. 1 shows a local coil for magnetic resonance applications in accordance with the invention in plan view.

As shown in FIG. 1, a local coil for magnetic resonance applications comprises a base body 1. The base body 1 is fashioned with inherent stability. When no forces (indicated in FIG. 1 by force arrows F) affect the base body 1, the base body 1 assumes the inherent form shown in FIG. 1. The inherent form of the base body 1 is thus a substantially circular ring with a diameter D. The diameter D is, for example, 2 to 5 cm.

Figure 2:
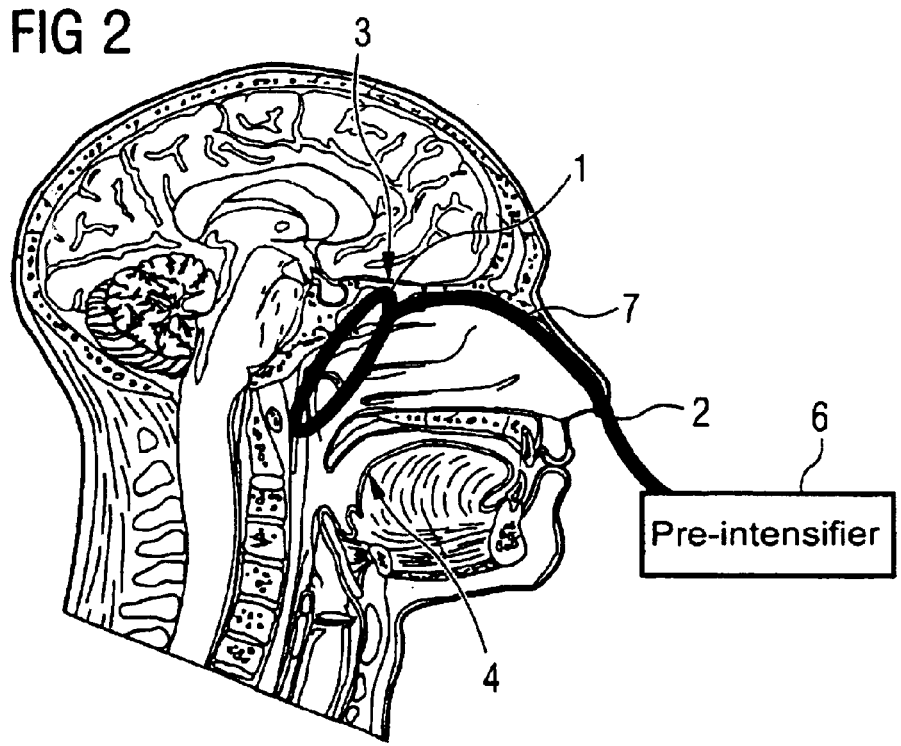
FIG. 2 shows an application of the local coil of FIG. 1.

The base body 1 also is fashioned flexibly. When the base body 1 is subjected to a deforming force (see force arrows F) the base body 1 yields. This is indicated in FIG. 1 by deflection arrows A. Thus, when the base body 1 is compressed, for example manually, the shape of the base body 1 changes from a circle to an elongated ellipse. Due to this flexibility of the base body 1, it is possible to insert the base body 1 into the nasal cavity 3 of a person via a nostril 2, as is symbolically indicated in FIG. 2. Naturally, at a later point in time the base body 1 can be removed from the nasal cavity 3 again via the nostril 2.

As already mentioned, the diameter D of the base body 1 is (only) 2 to 5 cm. Due to this dimensioning, the base body 1 therefore substantially assumes its inherent form given arrangement in the nasal cavity 3 (or alternatively in a palate 4 of the person).

As is visible from FIG. 1, a reception antenna 5 is embedded in the base body 1. A magnetic resonance signal (excited by an excitation antenna (not shown)) can be received by the reception antenna 5. The magnetic resonance signal can be conveyed by the reception antenna 5 to an evaluation device via a subsequently arranged pre-intensifier 6 and a cable 7. The evaluation device is not shown in FIG. 1.

The base body 1 can be inserted into the nasal cavity 3 and removed again from it by use of the cable 7. The cable 7 therefore is fashioned as a flexible cable 7, since otherwise an insertion of the base body 1 into the nasal cavity 3 would not be possible.

As shown in FIG. 1, the pre-intensifier 6 is integrated into the base body 1. In contrast to this, according to FIG. 2 the pre-intensifier 6 is connected with the base body 1 via the cable 7. Both methods are in principle equivalent. In the first case, a more compact arrangement results, in the second case it is not necessary to also insert the pre-intensifier 6 into the human body.

Figure 3:
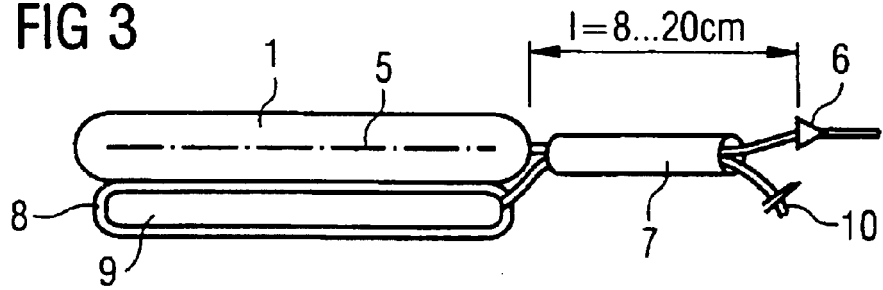
FIG. 3 shows a local coil for magnetic resonance applications in accordance with the invention from the side.

As can be send from FIG. 3, the cable 7 between the base body 1 and the pre-intensifier 6 exhibits a length l between 8 and 20 cm. In this case, the intensifier 6 is thus separated from the base body 1 by this length l.

As can be further seen from FIG. 3, the base body 1 is connected to a supplementary body 8. The supplementary body 8 must likewise be fashioned elastically so that the base body 1 can be inserted further into the nasal cavity 3 of the person. According to FIG. 3, the supplementary body 8 is arranged adjacently on one side of the base body 1.

In the simplest case, the supplementary body 8 is simply formed of an elastomer. However, the supplementary body 8 preferably has a cavity 9 that can be filled with a gaseous or liquid medium via a connection 10. The form stability of the base body 1 can then be increased after the insertion into the nasal cavity 3, and reduced again before the removal of the base body 1 from the nasal cavity 3.

A significant improvement of the image quality can be achieved for examinations in the region of the base of the skull of a person by the use of the inventive local coil—so to speak a nasal cavity coil. This is particularly true for examinations which require a high magnetic resonance signal, thus for fast measurements, measurements with lesser slice thickness, and for magnetic resonance spectroscopy, in particular multi-core spectroscopy.

Although modifications and changes may be suggested by those skilled in the art, it is the intention of the inventors to embody within the patent warranted hereon all changes and modifications as reasonably and properly come within the scope of their contribution to the art.

We claim as our invention:

1. A local coil for magnetic resonance applications, comprising:

an annular base body having an inherent stability causing said base body to assume an inherent form in an absence of deforming forces acting on said base body;

an antenna resonator embedded in said base body and adapted to receive a magnetic resonance signal; and said base body having a flexibility allowing said base body to be inserted via a nostril into the nasal cavity of a subject in whom said magnetic resonance signal is generated, and allowing said base body to be removed from the nasal cavity via the nostril, said base body, in the nasal cavity substantially assuming said inherent form.

2. A local coil as claimed in claim 1 wherein said base body also is adapted to assume said inherent form when placed in the palate of the subject.

3. A local coil as claimed in claim 1 comprising an elastic supplementary body connected to said base body.

4. A local coil as claimed in claim 3 wherein said supplementary body has an interior cavity and a connection allowing said interior cavity of said supplementary body to be filled with a fluid.

5. A local coil as claimed in claim 3 wherein said supplementary body is connected adjacent to a side of said base body.

6. A local coil as claimed in claim 1 comprising a pre-intensifier connected following said antenna resonator in a propagation direction of said magnetic resonance signal.

7. A local coil as claimed in claim 6 wherein said pre-intensifier is integrated into said base body.

8. A local coil as claimed in claim 6 comprising a cable connecting said pre-intensifier with said base body.

9. A local coil as claimed in claim 8 wherein said cable has a length in a range between 8 cm and 20 cm.

* * * * *